United States Patent
Urashima

(10) Patent No.: US 7,479,663 B2
(45) Date of Patent: Jan. 20, 2009

(54) GALLIUM NITRIDE-BASED SEMICONDUCTOR LIGHT EMITTING DEVICE AND PROCESS FOR ITS PRODUCTION

(75) Inventor: Yasuhito Urashima, Ichihara (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 11/519,148

(22) Filed: Sep. 12, 2006

(65) Prior Publication Data
US 2007/0057272 A1 Mar. 15, 2007

Related U.S. Application Data

(60) Provisional application No. 60/718,332, filed on Sep. 20, 2005.

(30) Foreign Application Priority Data
Sep. 12, 2005 (JP) ............................. 2005-263297

(51) Int. Cl.
*H01L 27/15* (2006.01)
(52) U.S. Cl. ........................... 257/98; 257/79; 257/103; 257/E33.001; 438/29; 438/43
(58) Field of Classification Search ................ 438/43; 257/103, 98
See application file for complete search history.

(56) References Cited

U.S. PATENT DOCUMENTS 6,794,690 B2   9/2004   Uemura 7,038,245 B2 *  5/2006  Nitta et al. ................... 257/95
2003/0052328 A1 *  3/2003  Uemura ...................... 257/103
2005/0093016 A1 *  5/2005  Yamamoto et al. .......... 257/103

FOREIGN PATENT DOCUMENTS

| JP | 11-220171 | 8/1999 |
|---|---|---|
| JP | 2003-168823 | 6/2003 |
| JP | 2005-203618 | 7/2005 |

* cited by examiner

*Primary Examiner*—Evan Pert
*Assistant Examiner*—Scott R Wilson
(74) *Attorney, Agent, or Firm*—Sughrue Mion, PLLC

(57) ABSTRACT

It is an object of the present invention to inhibit exposure of Ag in Ag-employing reflective electrodes caused by microdefects generated during the manufacturing process, and to prevent reduction in light emission output and deterioration in current-voltage characteristics resulting from shorting of the light emitting device.

The semiconductor light emitting device comprises an n-type semiconductor layer, a light emitting layer and a p-type semiconductor layer in that order on a substrate, with a negative electrode and positive electrode each formed in contact with the n-type semiconductor layer and p-type semiconductor layer, respectively. The positive electrode comprises at least a contact metal layer composed of at least one type of metal selected from the group consisting of Pt, Ir, Rh, Pd, Ru and Re or their alloy in contact with the p-type semiconductor layer, a reflective layer composed of a metal or alloy containing Ag as the main component on the contact layer, and one or more protective metal layers containing no Ag, covering the top and side surfaces of the reflective layer.

16 Claims, 1 Drawing Sheet

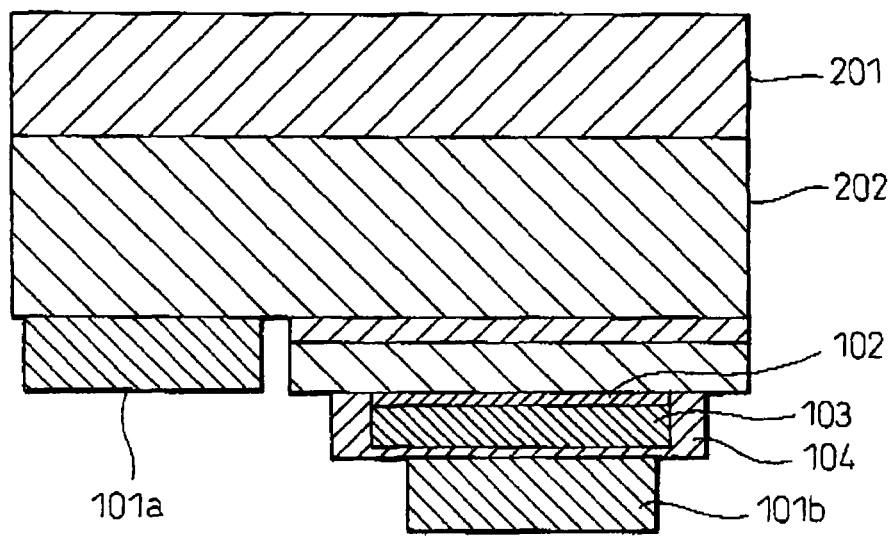
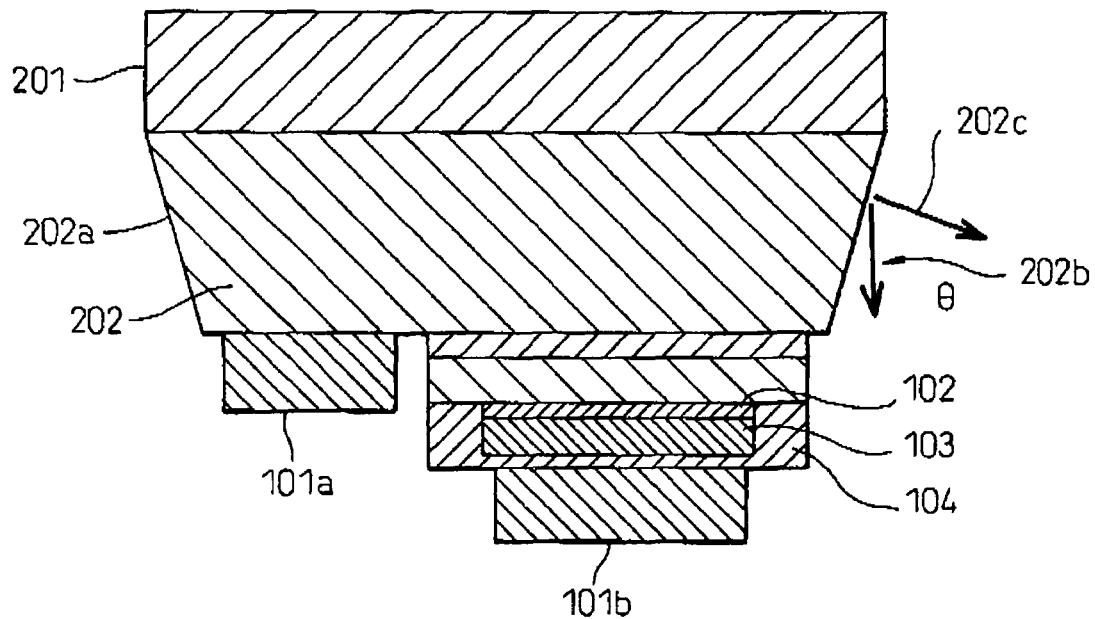

GALLIUM NITRIDE-BASED SEMICONDUCTOR LIGHT EMITTING DEVICE AND PROCESS FOR ITS PRODUCTION

CROSS REFERENCE TO RELATED APPLICATIONS

This application claims benefit of Provisional Application Ser. No. 60/718,332 filed Sep. 20, 2005, incorporated herein by reference, under 35 U.S.C. 111(b) pursuant to 35 U.S.C. 119(e)(1).

BACKGROUND OF THE INVENTION

1. Field of the Invention

The present invention relates to a gallium nitride-based semiconductor light emitting device, and particularly to a gallium nitride-based semiconductor light emitting device which employs Ag in the electrode for increased light reflectivity, while preventing migration of Ag and exhibiting increased reliability as a light emitting diode.

2. Description of the Related Art

Group III nitride semiconductors such as gallium nitride have a direct band gap of energy corresponding from the visible light range to the ultraviolet range and are capable of high efficiency luminosity, and therefore they are used in products such as light emitting diodes (LED) and laser diodes (LD). In particular, the realization of white light emitting diodes by combination with fluorescent materials has widened their potential uses as illuminating LEDs, and the market for these is increasing. In order to obtain an illuminating LED it is first necessary to achieve the high efficiency of a fluorescent lamp (1 m/W).

A common structure for high-efficiency Group III nitride semiconductor elements is a flip-chip structure wherein the electrode surface and luminescent region are mounted on the lower side of a pedestal, and light is extracted from the sapphire base side.

Since in a flip-chip structure the element region is mounted below on a pedestal via a metal electrode, the heat resistance is lower than in a face-up element structure in which it is mounted via the substrate, and the structure is therefore advantageous for uses in which a pulse heavy current is applied for high light emission output.

In the flip-chip structure, light reflected at the electrode constitutes a major proportion of the output, and therefore a metal with high reflectivity must be selected for the electrode metal. Among metals, Ag is known to have high reflectivity in the visible light range, and a flip-chip element employing an Ag reflective electrode can achieve a 10-20% increase in output over a flip-chip element employing a different metal.

However, Ag metal is also known to be prone to electromigration, and electrodes with exposed Ag electrode sections inevitably suffer reduction in light emission output and deterioration in current-voltage characteristics due to shorting of the electrified elements.

It has been proposed to provide separate metal or oxide films over Ag electrodes by such techniques as vapor deposition or sputtering in order to avoid exposed sections on the Ag electrode.

By thus covering the surface of the Ag electrode with a separate metal or oxide film, it is attempted to minimize migration from the Ag electrode (see Japanese Unexamined Patent Publication No. 11-220171, No. 2003-168823 and No. 2005-203618.

Ideally, if the surface of the Ag electrode is completely covered in a protected electrode employing a separate metal it should be possible to prevent deterioration of the element characteristics, but in actual practice it has been difficult to avoid exposure of Ag due to problems in the manufacturing process.

For example, when a different metal is vapor deposited on a wafer having an Ag electrode formed thereon, it has been confirmed that adhesion of particles creates a problem where the metal does not envelop around the areas under the particle shadows, such that when the particles are shed after vapor deposition they leave sections with exposed Ag.

In nitride semiconductor elements, the electrode is generally formed by a technique such as vapor deposition or sputtering. These techniques form films by the kinetic energy produced upon vaporization of metals under high vacuum, but when the film-forming pressure is between $10^{-4}$ Pa and 10 Pa, the mean free path of the metal particles is in the range of several meters to several tenths of millimeters, thereby limiting envelopment of the metal material in the particle shadows.

SUMMARY OF THE INVENTION

It is an object of the present invention to inhibit exposure of Ag in Ag-employing reflective electrodes (reflective layers) caused by microdefects generated during the manufacturing process, and to prevent reduction in light emission output and deterioration in current-voltage characteristics resulting from shorting of the light emitting device.

The present invention has been accomplished in order to achieve the aforestated object, and it comprises the following inventions.

(1) A semiconductor light emitting device characterized by comprising an n-type semiconductor layer, a light emitting layer and a p-type semiconductor layer in that order on a substrate, with a negative electrode and positive electrode each formed in contact with the n-type semiconductor layer and p-type semiconductor layer, respectively, wherein the positive electrode comprises at least a contact metal layer composed of at least one type of metal selected from the group consisting of Pt, Ir, Rh, Pd, Ru and Re or their alloy in contact with the p-type semiconductor layer, a reflective layer composed of a metal or alloy containing Ag as the main component on the contact layer, and one or more protective metal layers containing no Ag, covering the top and side surfaces of the reflective layer.

(2) A semiconductor light emitting device according to (1) above, characterized in that the Ag content of the reflective layer composed mainly of Ag is 90-99.99 wt %.

(3) A semiconductor light emitting device according to (1) above, characterized in that at least one layer among the protective metal layers is formed by a plating process.

(4) A semiconductor light emitting device according to (1) above, characterized in that the thicknesses of the protective metal layers are between 100 nm and 10 µm.

(5) A semiconductor light emitting device according to (1) above, characterized in that the metal formed by the plating process is any metal from among Ni, Cu, Au and Cr or an alloy composed mainly of at least one of these metals.

(6) A semiconductor light emitting device according to (1) above, characterized by having a metal layer formed by means other than a plating process on the protective metal layers formed by the plating process.

(7) A semiconductor light emitting device according to (6) above, characterized in that the metal layer formed by means other than a plating process is a metal or alloy composed mainly of Au or Al.

(8) A semiconductor light emitting device according to (1) above, characterized in that a plating undercoat layer composed of at least one metal selected from among Pt, Ir, Rh, Pd, Ru and Re or an alloy comprising at least one of these metals is formed under the protective metal layers.

(9) A semiconductor light emitting device according to (1) above, characterized in that at least portions of the side surfaces of the semiconductor layer form an inclination angle with respect to the normal to the semiconductor layer surface.

(10) A semiconductor light emitting device according to (9) above, characterized in that the inclination angle is a positive angle with respect to the normal to the semiconductor layer surface.

(11) A semiconductor light emitting device according to (9) above, characterized in that the inclination angle is a negative angle with respect to the normal to the semiconductor layer surface.

(12) A semiconductor light emitting device according to (10) or (11) above, characterized in that the inclination angle is 30°-70° as the angle formed between the normal to the semiconductor layer surface and the normal to the semiconductor layer side surface.

(13) A semiconductor light emitting device according to (1) above, characterized in that the semiconductor is a Group III-V semiconductor.

(14) A semiconductor light emitting device according to (13) above, characterized in that the Group III-V semiconductor is a gallium nitride-based semiconductor.

(15) A light emitting device obtained by combining a fluorescent material with a semiconductor light emitting device according to (1) above.

(16) A lamp employing a light emitting device according to (1) above.

(17) A process for fabrication of a semiconductor light emitting device, characterized by forming an n-type semiconductor layer, a light emitting layer and a p-type semiconductor layer in that order on a substrate, providing a negative electrode and positive electrode in contact with the n-type semiconductor layer and p-type semiconductor layer, respectively, forming as the positive electrode at least a contact metal layer composed of at least one type of metal selected from the group consisting of Pt, Ir, Rh, Pd, Ru and Re or their alloy in contact with the p-type semiconductor layer, and a reflective layer composed of a metal or alloy containing Ag as a component on the contact layer, and forming at least one protective metal layer containing no Ag, covering the top and side surfaces of the reflective layer, by a plating process.

Since the present invention includes a reflective layer containing Ag in the p-type electrode of a light emitting device that extracts light from the sides of the substrate, the light reflectivity is high. Furthermore, since the reflective layer is covered with a protective metal layer that prevents migration of Ag, an effect is produced of avoiding shorting of the light emitting device and resulting reduction in light emission output that occur due to migration of Ag, and of preventing deterioration of the current-voltage characteristics.

BRIEF DESCRIPTION OF THE DRAWINGS

FIG. 1 is a cross-sectional view of the gallium nitride-based semiconductor light emitting device fabricated in Example 1.

FIG. 2 is a cross-sectional view of the gallium nitride-based semiconductor light emitting device fabricated in Example 1.

DESCRIPTION OF THE PREFERRED EMBODIMENTS

The present invention will now be explained in detail with reference to the accompanying drawings.

FIG. 1 is a cross-sectional view showing an embodiment of a light emitting device according to the invention. In the embodiment illustrated here, a gallium nitride-based semiconductor (nitride semiconductor) is used as the semiconductor.

In the drawing, 201 is a substrate, over which a nitride semiconductor layer 202 is laminated.

The substrate used is not restricted in any way and may be a publicly known substrate material, for example, an oxide single crystal such as sapphire single crystal ($Al_2O_3$; a-surface, C-surface, M-surface, R-surface) or spinel single crystal ($MgAl_2O_4$), or a SiC single crystal. Sapphire single crystal is preferred among these. Because it has a refractive index of 1.7 which is smaller than that of the nitride semiconductor, the light extracting effect by working of the nitride semiconductor layer is increased. There are no particular restrictions on the plane orientation of the substrate, It may be a "just" substrate or an off-angle substrate. The sapphire substrate surface may also be worked to form irregularities.

An n-type semiconductor layer, light emitting layer and p-type semiconductor layer, each composed of a nitride semiconductor layer, are formed in that order on the substrate, with each layer being laminated under its respective optimum conditions. Here, the growth conditions for the semiconductor and buffer layer, the impurity doping conditions and the heat treatment method may be according to publicly known techniques without posing any particular problems.

After lamination of the nitride semiconductor layers, a publicly known photolithography technique is carried out to form a device isolation region and an n-type electrode-forming region. The nitride semiconductor layer on the substrate which has been patterned by photolithography is etched by dry etching using RIE (reactive ion etching). The type of gas used for the process is usually a chlorine-based gas. Gases such as $Cl_2$, $SiCl_4$ and $BCl_3$ are known, with mixture of $H_2$ or Ar as added gases, and combinations of these may be selected for use.

The etching is followed by a step of electrode formation. An electrode forming pattern is produced by publicly known photolithography, and the electrode is formed by a technique such as vapor deposition, sputtering or plating. Formation of the electrode layer by plating is preferred when a protective metal layer is formed as described hereunder. Either the n-type electrode (n-electrode) 101a or p-type electrode (p-electrode) 101b may be formed first. The positioning of the electrodes may be any positioning such as diagonal, opposite side or eccentric, with no particular problems.

Various types of compositions and structures are known for n-electrodes, and any such known n-electrodes may be used without any restrictions whatsoever.

The n-type semiconductor layer will generally have an n-type clad layer and a n-type contact layer thereover (substrate side), with a pad electrode for the n-type electrode provided in contact with the n-type contact layer. The material used for the pad electrode may be Al, Ti, Ni or Au, or even Cr, W, V or the like. Needless to mention, the entire n-electrode may be imparted with a bonding property to form a multilayer structure. Most preferably, the outermost layer is covered with Au or Al to facilitate bonding.

Various compositions and structures are known for p-electrodes for the contact metal layer serving as the p-electrode formed on the contact layer of the p-type semiconductor, and such known p-electrodes may be used without any restrictions whatsoever. Preferred are metals selected from the group consisting of Pt, Ir, Rh, Pd, Ru and Re, and their alloys, because they can yield a high work function and low contact resistance. The contact metal layer preferably has a thickness in the range of 0.5-5 nm.

A reflective layer 103 is formed on the contact metal layer 102 serving as the p-electrode. The reflective layer contains Ag which has high reflectivity for the visible light range, but from the standpoint of improved corrosion resistance it is preferably an alloy containing at least one element selected from the group consisting of neodymium, palladium, copper and bismuth.

An alloy with an Ag content of 90-99.99% in the reflective layer is preferred from the standpoint of reflectivity and corrosion resistance.

A protective metal layer 104 is provided covering the top and side surfaces of the reflective layer 103. More preferably, the protective metal layer is formed to also cover the side surfaces of the contact metal layer. The protective metal layer may be formed of any publicly known metal that contains no Ag. The protective metal layer may be either a single metal layer or a multi-metal layer, but it is preferably a multi-metal layer. When the protective metal layer is formed by plating, the Ag in the reflective layer will sometimes erode depending on the plating bath composition, and it is preferred to form a metal layer beforehand to serve as both a plating undercoat layer and an Ag-protecting layer on the Ag reflective layer prior to forming the protective metal layer by plating. The plating undercoat layer is preferably at least one metal selected from the group consisting of Pt, Ir, Rh, Pd, Ru and Re, or an alloy thereof, from the standpoint of preventing diffusion of Ag and increasing the plating bath resistance.

The protective metal layer formed by plating is preferably an alloy composed mainly of any metal from among Ni, Cu, Au and Cr. The plating method may be either electroplating or electroless plating, but electroless plating is preferred for more convenience in terms of equipment used, and alloys composed mainly of metals from among Ni, Cu, Au and Cr are suitable for formation by electroless plating steps.

The thickness of the protective metal layer formed by the plating is preferably 1000 Å or greater. A thickness of less than 1000 Å will be inadequate to bury fine defects produced in the electrode during the process, and for this reason the thickness is preferably 2000 Å or greater and more preferably 5000 Å or greater. However, if the plating layer thickness is too great, in-plane thickness variation may become a problem, and the thickness is therefore preferably no greater than 10 µm.

There is no problem if the protective metal layer is simultaneously formed on the n-electrode by plating. From the standpoint of bonding it is also preferred to form a metal or alloy composed mainly of Au or Al on the protective metal layer in the same manner as the n-electrode, and the bonding layer is preferably formed simultaneously with the bonding layer on the n-electrode.

The nitride semiconductor light emitting device preferably has an inclined surface 202a as shown in FIG. 2 slanted with respect to the normal 202b to the semiconductor layer surface, on at least portions of the side surfaces around the periphery of the nitride semiconductor layer. If the side surfaces around the periphery of the nitride semiconductor layer are perpendicular to the normal to the nitride semiconductor layer surface, the small size of the region separating the elements will result in poor circulation of liquid during formation of the plating film, and the thickness of the formed plating film will tend to be increased at the center of the element. At least a portion of the nitride semiconductor layer is preferably inclined at an angle in order to improve liquid circulation. Naturally, the inclined surface may reach to the substrate.

The inclination of the side surfaces of the nitride semiconductor layer may have a positive angle whereby the electrode side of the semiconductor layer narrows and a negative angle whereby the opposite electrode side widens. If the side surfaces have a positive angle, the opening will widen toward the semiconductor surface side, thereby aiding circulation of the plating liquid. However, because the element size will tend to be smaller, a positive angle for the inclined surface will restrict the area of the light emitting region of the element surface.

There is no problem if the inclination of the side surfaces of the nitride semiconductor layer forms a negative angle with respect to the normal to the surface. When inclination of the side surfaces is restricted by the element size as mentioned above, the side surface inclination is preferably a negative angle since this will still ensure a sufficient region for circulation of the plating liquid.

The side surface inclination is preferably an angle such that the angle θ formed between the normal to the semiconductor layer surface 202b and the normal to the semiconductor layer side surface 202c is 30-70°. If the inclination angle is too large the effective element area will be reduced, and if it is too small the region required for liquid circulation will not be adequately ensured, and therefore the preferred range is 30-70°.

The semiconductor used for the light emitting device of the invention is preferably a Group III-V compound semiconductor, and most preferably it is a gallium nitride-based semiconductor.

Examples of the invention will now be explained. However, the invention is not limited to these examples.

EXAMPLE 1

Using a sapphire ($Al_2O_3$) C-surface substrate as the substrate, there were laminated thereover an undoped GaN layer to 6 µm and an n-type contact layer periodically doped with Ge to a mean carrier concentration of $1 \times 10^{19}$ $cm^{-3}$ to 4 µm, and five times in an alternating fashion a 12.5 nm n-clad layer made of $In_{0.1}Ga_{0.9}N$, a 16 nm-thick barrier layer made of GaN and a 2.5 nm-thick well layer made of $In_{0.2}Ga_{0.8}N$, via an AlN buffer according to the method disclosed in Japanese Unexamined Patent Publication No. 2003-243302, and then finally a luminescent layer having a multiple quantum well structure provided with barrier layer, a 0.05 µm-thick p-clad layer composed of Mg-doped ($8 \times 10^{19}/cm^3$ concentration) $Al_{0.2}Ga_{0.8}N$ and a 0.15 µm-thick p-contact layer composed of Mg-doped ($8 \times 10^{19}/cm^3$ concentration) $Al_{0.03}Ga_{0.97}N$ were laminated in that order to obtain a nitride semiconductor layer on the substrate.

Publicly known lithography and $Cl_2$ gas RIE were used to expose the individual element boundary sections and n-type contact layer sections on the surface of the nitride semiconductor layer. Acetone was then used for removal of the resist used for the lithography.

After organic washing and HCl boiling to remove contaminants and oxides on the wafer surface, it was again subjected to lithography to form p-type electrode regions using a resist.

The wafer subjected to lithography was introduced into a sputtering apparatus and brought to a vacuum of $1 \times 10^{-4}$ Pa, and then Ar was introduced keeping the pressure at 0.5 Pa. Pt was accumulated to 5 nm as a contact metal under pressure control with a 500 W RF system.

A reflective layer comprising 99 wt % Ag-0.5 wt % Nd-0.5 wt % Cu was then accumulated to 100 nm in the same apparatus, and Pt was further accumulated to 10 nm as a plating undercoat layer. Upon completing accumulation of the metal layer, the resist was removed and electrode patterning was performed.

The wafer on which the plating undercoat layer had been formed was subjected to electroless plating with Ni in a plating bath to form a metal protective layer. The plating solution was an alkali solution composed mainly of Ni sulfate and phosphinic acid, with addition of other components such as ethylenediamine, citric acid and sodium stannate. Immersion was carried out for 10 minutes in the bath to obtain a 2 µm-thick film.

Lithography was again performed to form a pad electrode forming region. The n-pad electrode and p-pad electrode regions were formed simultaneously. The wafer subjected to lithography was introduced into a vapor deposition apparatus and brought to a vacuum of $1 \times 10^{-4}$ Pa, and then Cr, Ti and Au were EB (electron beam) vapor deposited in that order to thicknesses of 40 nm, 100 nm and 1 µm, respectively, to form pad electrodes.

After formation of the electrodes, the wafer was thinned to 80 µm by front-back polishing, and the elements were separated by scribe and break. After separation, the elements were mounted on a submount on a TO18 package with the sapphire substrate sides facing upward. The samples were evaluated with an integrating sphere, and the results indicated initial characteristics with an output of 11 mW, a forward voltage Vf of 3.4V and a reverse voltage Vr of >20V.

After the initial evaluation, the elements were subjected to current testing for 168 hours in an atmosphere of 85° C./85% RH, upon which a reduction in output of −10% was seen with respect to the initial value, while the forward voltage Vf and reverse voltage Vr were unchanged. After current testing, the elements were observed from the substrate side, and no change in electrode outer appearance was found.

EXAMPLE 2

This is an example of forming an inclination surface on the semiconductor side surfaces. Although an inclination surface with a positive angle was formed on the semiconductor side surfaces in this example, the same effect is achieved if the inclination surface has a negative angle.

The inclination surface was formed by dry etching. First, the individual element boundary sections and n-type contact layer sections were exposed under the same conditions as in Example 1. The etching depth was 0.8 µm. After removal of the resist, the resist was reapplied and lithography was performed to expose only the boundary sections. Etching was performed to 8 µm for a longer etching time than the first etching, for removal almost to the substrate. Because of the extended time, receding of the resist was no longer negligible, and as it disappeared from the edges a natural inclination surface was formed on the etching surface, The inclination angle θ was 50°-60°.

After releasing the resist, there were accumulated a Pt contact layer, Ag reflective layer and Pt protective layer by sputtering under the same conditions as in Example 1, and then a Ni protective layer was deposited to 2 µm by a plating process. Whereas the film thickness of the Ni formed in Example 1 produced a distribution of about 8% in the plane of the wafer, the in-plane distribution improved to about 2% in Example 2.

Next, an Au pad was formed under the same conditions as in Example 1, and the elements were evaluated. The samples were evaluated with an integrating sphere, which indicated initial characteristics with an output of 11 mW, a forward voltage Vf of 3.4V and a reverse voltage Vr of >20V, while in a current test at 85° C./85% RH, no deterioration was found in the forward voltage or reverse voltage.

Moreover, due to the reduced thickness distribution as a result of plating, an improvement was also seen in the disturbance of chip orientation that occurred during mounting in Example 1.

COMPARATIVE EXAMPLE

For comparison, there was fabricated an element with no plating-formed electrode.

The method of fabricating the sample was the same as in Example 1 up to the step prior to electrode formation by sputtering. A Pt contact metal layer, Ag reflective layer and Pt protective layer were then formed by sputtering under the same conditions as in Example 1.

After forming the Pt layer, Ni was accumulated to 5000 Å with an RF system. The steps from vapor deposition of the pad electrode onward were carried out under the same conditions as in Example 1.

In the initial evaluation after separating the elements, the initial characteristics of the obtained elements were an output of 11 mW, a forward voltage Vf of 3.4V and a reverse voltage Vr of >20V. When the current test was performed in the same atmosphere of 85° C./85% RH as in Example 1, the output fell to under 50% in about 20% of the elements, and reductions in Vf and Vr were also seen.

When the samples exhibiting deterioration in the current test were examined, the Ag reflective electrode was seen to have undergone brown discoloration, while discoloration was also found on the chip surface and submount. When the discolored sections were observed by EDX analysis with an electron microscope, Ag was detected therein.

The effect of the invention can inhibit element failure due to microdefects generated during the fabrication process for electrodes employing Ag, and can therefore increase the reliability of such elements.

The light emitting device of the invention is not only advantageous itself as a lamp for various lighting purposes, but it can be combined with fluorescent materials for use as an element for emission of white light, etc.

The light emitting device of the present invention may be subjected onto a submount, connected by wiring to a lead frame and sealed with resin to advantageously fabricate an LED lamp resembling a cannonball, which may be accomplished by use of the conventional methods.

Further, the light emitting device of the present invention can be combined with a fluorescent substance such as a YAG-based phosphor or silicate phosphor, using a conventional method, to provide an improved light emitting device in which the color of light is controlled.

What is claimed is:

1. A semiconductor light emitting device characterized by comprising an n-type semiconductor layer, a light emitting layer and a p-type semiconductor layer in that order on a substrate, with a negative electrode and positive electrode each formed in contact with the n-type semiconductor layer and p-type semiconductor layer, respectively, wherein the positive electrode comprises at least a contact metal layer composed of at least one type of metal selected from the group consisting of Pt, Ir, Rh, Pd, Ru or Re or their alloy in contact with the p-type semiconductor layer, a reflective layer composed of a metal or alloy containing Ag as the main component on the contact layer, and one or more protective metal layers containing no Ag, completely covering the top and side surfaces of the reflective layer wherein the thicknesses of the one or more protective metal layers are between 500 nm and 10 µm; and wherein an undercoat layer composed of at least one metal selected from among Pt, Ir, Rh, Pd, Ru and Re or an alloy comprising at least one of these metals is formed between the reflective layer and the one or more protective metal layers in contact with the both layers.

2. The semiconductor light emitting device according to claim 1, characterized in that the Ag content of the reflective layer composed mainly of Ag is 90-99.99 wt %.

3. The semiconductor light emitting device according to claim 1, characterized in that at least one layer among the one or more protective metal layers is formed by a plating process.

4. The semiconductor light emitting device according to claim 3, characterized in that the metal formed by the plating process is any metal from among Ni, Cu, Au and Cr or an alloy composed mainly of at least one of these metals.

5. The semiconductor light emitting device according to claim 3, comprising a metal layer formed by means other than a plating process on the one or more protective metal layers formed by the plating process.

6. The semiconductor light emitting device according to claim 5, characterized in that the metal layer formed by means other than a plating process is a metal or alloy composed mainly of Au or Al.

7. The semiconductor light emitting device according to claim 1, characterized in that at least portions of the side surfaces of the n-type semiconductor layer form an inclination angle with respect to the normal to the semiconductor layer surface.

8. The semiconductor light emitting device according to claim 7, characterized in that the inclination angle is a positive angle with respect to the normal to the n-type semiconductor layer surface.

9. The semiconductor light emitting device according to claim 8, characterized in that the inclination angle is 30°-70° as the angle formed between the normal to the n-type semiconductor layer surface and the normal to the n-type semiconductor layer side surface.

10. The semiconductor light emitting device according to claim 7, characterized in that the inclination angle is a negative angle with respect to the normal to the n-type semiconductor layer surface.

11. The semiconductor light emitting device according to claim 10, characterized in that the inclination angle is 30°-70° as the angle formed between the normal to the semiconductor layer surface and the normal to the semiconductor layer side surface.

12. The semiconductor light emitting device according to claim 1, characterized in that the semiconductor is a Group III-V semiconductor.

13. The semiconductor light emitting device according to claim 12, characterized in that the Group III-V semiconductor is a gallium nitride-based semiconductor.

14. A light emitting device obtained by combining a fluorescent material with a semiconductor light emitting device according to claim 1.

15. A lamp employing a light emitting device according to claim 1.

16. A process for fabrication of a semiconductor light emitting device characterized by comprising an n-type semiconductor layer, a light emitting layer and a p-type semiconductor layer in that order on a substrate, with a negative electrode and positive electrode each formed in contact with the n-type semiconductor layer and p-type semiconductor layer, respectively, wherein the positive electrode comprises at least a contact metal layer composed of at least one type of metal selected from the group consisting of Pt, Ir, Rh, Pd, Ru and Re or their alloy in contact with the p-type semiconductor layer, a reflective layer composed of a metal or alloy containing Ag as the main component on the contact layer, and one or more protective metal layers containing no Ag, completely covering the top and side surfaces of the reflective layer wherein the thicknesses of the one or more protective metal layers are between 500 nm and 10 µm; and wherein an undercoat layer composed of at least one metal selected from among Pt, Ir, Rh, Pd, Ru and Re or an alloy comprising at least one of these metals is formed between the reflective layer and the one or more protective metal layers in contact with the both layers, said process characterized by forming an n-type semiconductor layer, a light emitting layer and a p-type semiconductor layer in that order on a substrate, providing a negative electrode and positive electrode in contact with the n-type semiconductor layer and p-type semiconductor layer, respectively, forming as the positive electrode at least a contact metal layer composed of at least one type of metal selected from the group consisting of Pt, Ir, Rh, Pd, Ru and Re or their alloy in contact with the p-type semiconductor layer, and a reflective layer composed of a metal or alloy containing Ag as a component on the contact layer, and forming at least one protective metal layer containing no Ag, completely covering the top and side surfaces of the reflective layer, by a plating process.

* * * * *